(12) United States Patent
Bellessort et al.

(10) Patent No.: US 9,338,258 B2
(45) Date of Patent: May 10, 2016

(54) METHODS AND NETWORK DEVICES FOR COMMUNICATING DATA PACKETS

(71) Applicant: CANON KABUSHIKI KAISHA, Tokyo (JP)

(72) Inventors: Romain Bellessort, Rennes (FR); Youenn Fablet, La Dominelais (FR); Hervé Ruellan, Rennes (FR)

(73) Assignee: Canon Kabushiki Kaisha, Tokyo (JP)

( * ) Notice: Subject to any disclaimer, the term of this patent is extended or adjusted under 35 U.S.C. 154(b) by 719 days.

(21) Appl. No.: 13/665,773

(22) Filed: Oct. 31, 2012

(65) Prior Publication Data

US 2013/0114626 A1    May 9, 2013

(30) Foreign Application Priority Data

Nov. 8, 2011  (GB) .................................. 1119224.2

(51) Int. Cl.
*H04L 29/06* (2006.01)
*H03M 7/30* (2006.01)

(52) U.S. Cl.
CPC ............. *H04L 69/04* (2013.01); *H03M 7/3088* (2013.01); *H03M 7/6052* (2013.01); *H03M 7/6058* (2013.01)

(58) Field of Classification Search
CPC .. H04L 69/04; H03M 7/6052; H03M 7/6058; H03M 7/3088
USPC .......................... 370/252, 352, 389, 468, 477
See application file for complete search history.

(56) References Cited

U.S. PATENT DOCUMENTS 5,534,861 A    7/1996  Chang et al.
5,951,623 A    9/1999  Reynar et al.
(Continued)

FOREIGN PATENT DOCUMENTS

EP          0 933 876 A1    8/1999
EP          2044750 A2      1/2008
WO      WO 2011067769 A1 *  6/2011

OTHER PUBLICATIONS

"A Proposal for Shared Dictionary Compression over HTTP", Jon Butler et al., Google, Inc., Sep. 8, 2008. Obtained from: http://lists.w3.org/Archives/Public/ietf-http-wg/2008JulSep/att-0441/Shared_Dictionary_Compression_over_HTTP.pdf.
(Continued)

*Primary Examiner* — Mang Yeung
*Assistant Examiner* — Natali N Pascual Peguero
(74) *Attorney, Agent, or Firm* — Canon U.S.A., Inc. IP Division

(57) ABSTRACT

Methods and network devices for communicating data packets in a set of transmissions between a transmitter and a receiver of a communications network are described. The method includes prior exchanging transmitter-provided packet information and receiver-provided packet information between the transmitter and the receiver, generating an initial compression dictionary before the first transmission, based on the exchanged transmitter-provided packet information and the exchanged receiver-provided packet information. At the transmitter, the method further includes compressing the data packets of the first and subsequent transmissions of the set using the initial compression dictionary, and sending the compressed data packets over the communications network to the receiver. At the receiver, the method further includes receiving compressed data packets from the transmitter via the communications network, and decompressing the compressed data packets received in the first and subsequent transmissions of the set, using the initial compression dictionary. Improved compression of the first transmission is thus obtained.

22 Claims, 8 Drawing Sheets

(56) References Cited

U.S. PATENT DOCUMENTS

| | | | |
|---|---|---|---|
| 6,415,061 B1* | 7/2002 | Benayoun et al. | 382/253 |
| 7,796,592 B2 | 9/2010 | Stafford et al. | |
| 7,953,881 B1 | 5/2011 | Vadlakonda et al. | |
| 8,400,334 B2* | 3/2013 | Lee et al. | 341/51 |
| 2002/0037035 A1 | 3/2002 | Singh | |
| 2002/0057716 A1 | 5/2002 | Svanbro et al. | |
| 2004/0034708 A1 | 2/2004 | Pelletier et al. | |
| 2008/0037509 A1* | 2/2008 | Foti | 370/349 |
| 2009/0219930 A1* | 9/2009 | Dolganow et al. | 370/389 |
| 2011/0107190 A1* | 5/2011 | Henderson et al. | 714/798 |

OTHER PUBLICATIONS

"Scalable, Robust, Efficient Dictionary-Based Compression (SCRIBE)", Zhigang Liu et al., Nokia Research Center, Internet Engineering Task Force, IETF, Network Working Group Internet Draft, version 01, Jul. 18, 2001. Obtained from: http://tools.ietf.org/html/draft-liu-rohc-scribe-01.

* cited by examiner

HTTP headers

Host: en.wikipedia.org
User-Agent: Mozilla/5.0 (Windows; en-US) Gecko/20110303 Firefox/3.6.15
Accept: text/html,application/xhtml+xml,application/xml;q=0.9,*/*;q=0.8
Accept-Language: en-us,en;q=0.5
Keep-Alive: 115
Proxy-Connection: keep-alive

SPDY Initial compression dictionary optionsgetheadpostputdeletetraceacceptaccept-charsetaccept-encodingaccept-languageauthorizationexpectfromhostif-modified-sinceif-matchif-none-matchif-rangeif-unmodifiedsincemax-forwardsproxy-authorizationrangerefererteuser-agent100101200201202203204205206300301302303304305306307400401402403404405406407408409410411412413414415416417500501502503504505accept-rangesageetaglocationproxy-authenticatepublicretry-afterservervarywarningwww-authenticateallowcontent-basecontent-encodingcache-controlconnectiondatetrailertransfer-encodingupgradeviawarningcontent-languagecontent-lengthcontent-locationcontent-md5content-rangecontent-typeetagexpireslast-modifiedset-cookieMondayTuesdayWednesdayThursdayFridaySaturdaySundayJanFebMarAprMayJunJulAugSepOctNovDecchunkedtext/htmlimage/pngimage/jpgimage/gifapplication/xmlapplication/xhtmltext/plainpublicmax-agecharset=iso-8859-1utf-8gzipdeflateHTTP/1.1statusversionurl

Fig. 1

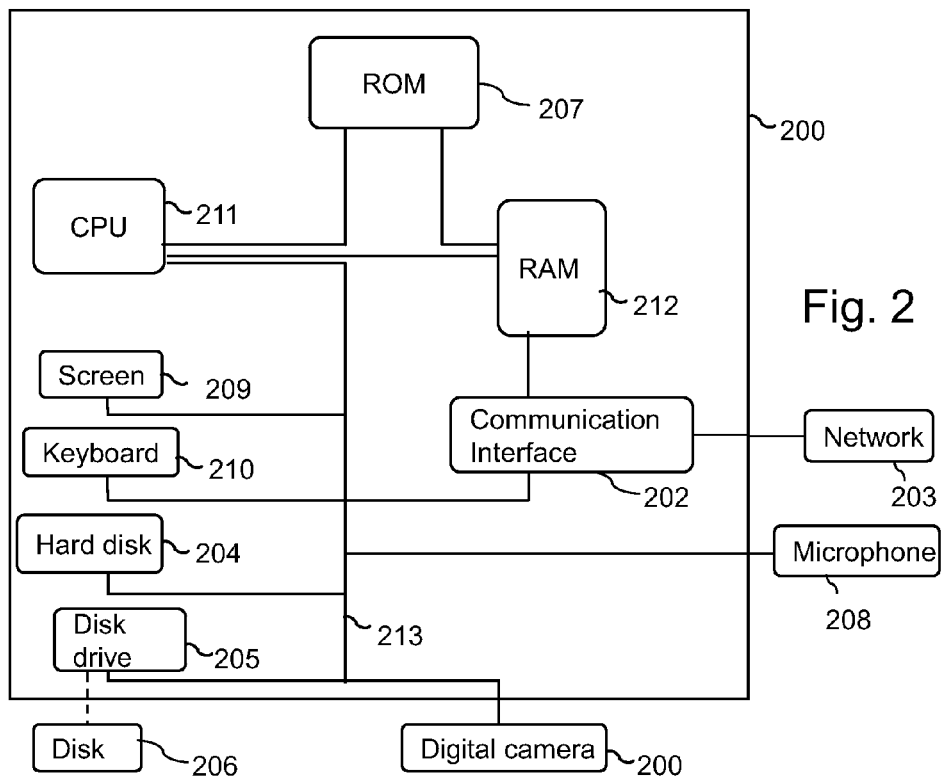

Fig. 2

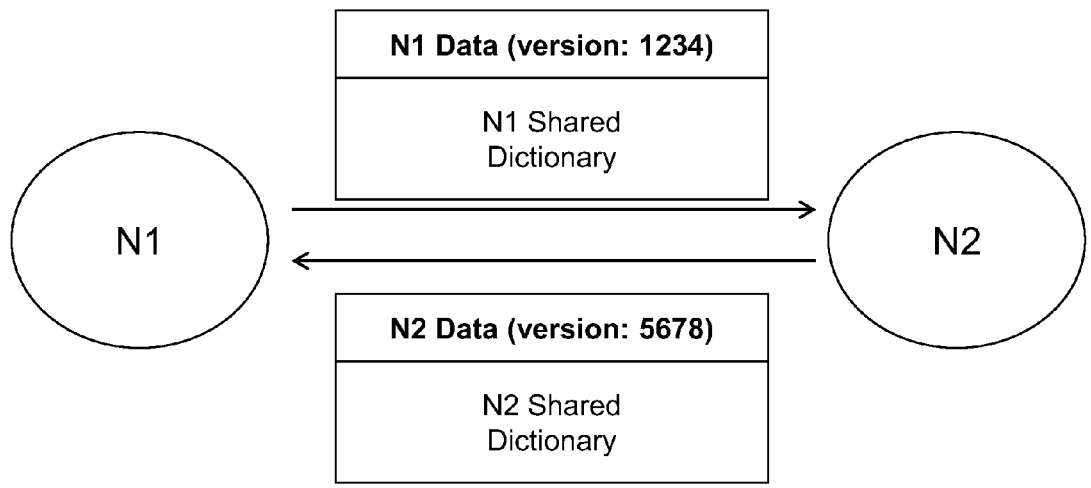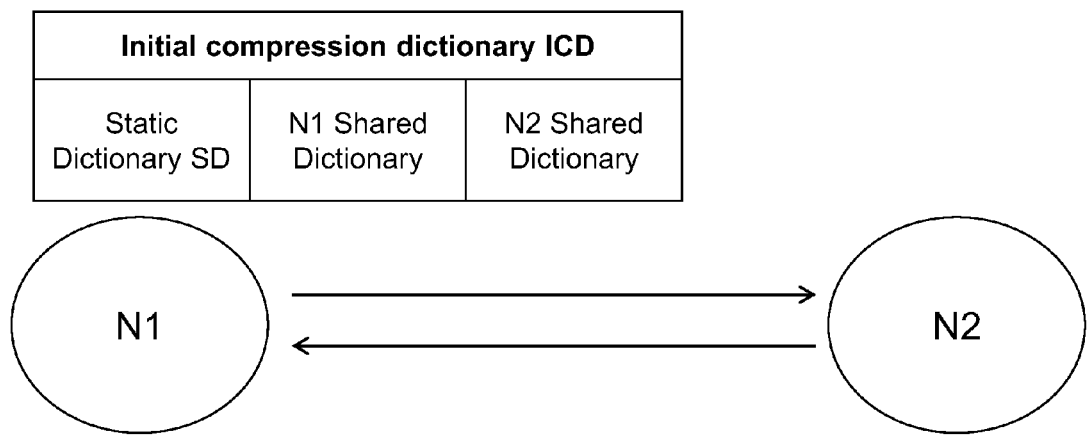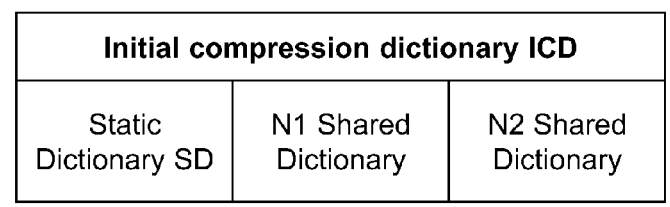
Fig. 3

```
<dictionary>
  <private>
  acceptaccept-charsetaccept-encodingaccept-languageuser-
agentMozilla/5.0 (Windows; en-  US) Gecko/20110303 Firefox/3.6.15
  </private>
  <shared>
    <version>HTTP/1.1</version>
    <types>text/html;image/jpg;image/gif;image/png</types>
    <languages>en;en-us</languages>
  </shared>
</dictionary>
```

N1 local dictionary

```
<dictionary>
  <private>
serverApachestatus100101200201202203204205206300301302303304305
306307400401402403404405406407408409410411412413414415416417
500501502503504505content-languagecontent-lengthcontent-
locationcontent-type
  </private>
  <shared>
    <version>HTTP/1.1</version>
    <types>text/html;image/jpg;image/gif</types>
    <languages>en</languages>
  </shared>
</dictionary>
```

N2 local dictionary

Fig. 9

METHODS AND NETWORK DEVICES FOR COMMUNICATING DATA PACKETS

This application claims priority from GB Patent Application No. 1119224.2, filed Nov. 8, 2011, which is hereby incorporated by reference in its entirety.

The present invention concerns methods and network devices for communicating data packets through a set of transmissions.

The invention belongs to the field of network communication, and in particular to the field of data compression used when sending data packets over a communications network.

Methods are known for communicating data packets through a set of transmissions between a transmitter and a receiver of a communications network, wherein the data packets for the transmissions are compressed using a compression dictionary, before they are sent over the network. This is the case for a large number of data transmission protocols, for example the well-known HTTP protocol wherein payload data are dictionary-based compressed, or the SPDY protocol (standing for SPeeDY) which provides improvements to the HTTP protocol.

Similarly, at the receiving side, compressed data packets received through the transmissions are decompressed also using a compression dictionary, generally the same one as used by the transmitter.

For purposes of illustration of the present invention, reference is now made to the SPDY protocol, although the invention may apply to other data transmission protocols.

HTTP (Hypertext Transfer Protocol) is commonly used to request and send web pages, and is based on a client/server architecture, wherein the client sends requests, namely HTTP requests, to the server, and the server replies to the client's requests with responses, namely HTTP responses.

Requests and responses are messages or data packets that comprise various parts, among which are non-compressed HTTP headers and HTTP payload.

FIG. 1 represents an example of six HTTP headers that are successively listed in an HTTP message.

An HTTP header consists of a name (in bold in the Figure) along with a corresponding value.

For instance, in "Host: en.wikipedia.org" Host is the header name, and its value is "en.wikipedia.org". This header is used to indicate the host of the requested resource (for instance, Wikipedia page describing HTTP, available at http://en.wikipedia.org/wiki/HTTP). HTTP headers are well-known by one skilled in the art, and therefore are not further detailed here.

In the first versions of HTTP, a TCP/IP connection was established for each HTTP request/response exchange.

SPDY is a protocol that improves HTTP in several ways.

First, it enables several HTTP requests and responses to be sent over a unique TCP/IP connection, thus defining a set of HTTP transmissions therein. In this way, all the components of a web page (HTML documents, images, JavaScript, etc.) may share the same TCP/IP connection, thus speeding up the web page loading.

Secondly, SPDY implements compression of the HTTP headers exchanged over the shared TCP/IP connection, using the Zlib Deflate algorithm (also known through the "zip" format). This compression reduces the network load.

The compression algorithm of SPDY has the ability to use an initial Deflate compression dictionary containing generic data that often occurs in HTTP headers, to improve compression. This compression dictionary is specific to the current TCP/IP connection during which it is used and it dynamically evolves to perform efficient compression. For example new data that are encountered during compression may be added to the dictionary to ensure efficient compression of further occurrences of the same data. Following the current connection, a new initial compression dictionary is loaded for the next TCP/IP connection.

SPDY specifies an initial compression dictionary which is the same in all cases: the same for each TCP/IP connection, and the same at the transmitter (compressor) and at the receiver (decompressor).

Bottom of FIG. 1 represents such a generic initial compression dictionary, denoted ICD, in a string format used as reference by Zlib Deflate to initialize a coding table for example.

The compression ratio of the HTTP headers in the majority of the transmissions of a current TCP/IP connection is good to excellent, in particular close to 15%. However, this is true only as from the second transmission of the TCP/IP connection.

Indeed, the HTTP header compression ratio for the first transmission in the TCP/IP connection is about 65% only.

This is because the HTTP headers tend to be redundant or similar from one transmission to the other. In such a situation, during the first transmission of the connection, the initial compression dictionary learns the unknown HTTP header data and does not yet compress them efficiently. Due to the redundancy of the HTTP headers, the second and further transmissions are much more efficiently compressed.

To further improve the compression efficiency, patent publication U.S. Pat. No. 5,534,861 describes an optimization of the dictionary initialization by removing some initial compression inefficiencies from the dictionary.

Another publication, U.S. Pat. No. 5,951,623, suggests selecting a dictionary from a list of dictionaries depending on the content of the data when compressing data. The index of the selected dictionary in the list is added to the compressed data. The variety of dictionaries in the list makes it possible to select a dictionary that is more efficient than the initial compression dictionary statically defined in SPDY.

In these two publications, the improvement in compression ratio for the first transmission remains low. This is mainly because there is still a need to learn, during the first transmission, data that are not yet defined in the initial compression dictionary.

The present invention has been devised to address one or more of the foregoing concerns.

According to a first aspect of the invention there is provided a method of communicating data packets in a set of transmissions between a transmitter and a receiver of a communications network, the method comprising:
exchanging transmitter-provided packet information and receiver-provided packet information between the transmitter and the receiver, before the set of transmissions;
generating an initial compression dictionary based on the exchanged transmitter-provided packet information and the exchanged receiver-provided packet information;
at the transmitter, compressing the data packets of the set of transmissions using the initial compression dictionary, and sending, through the set of transmissions, the compressed data packets over the communications network to the receiver.

Packet information includes data that defines the packet, such as for example data fields (e.g. HTTP headers as disclosed above). Since the exchange of transmitter-provided and receiver-provided information is generally done before establishing a connection in which the set of transmissions occurs, the generation of the initial dictionary is done before the first of these transmissions so that the data packets of the first and subsequent transmissions are compressed using that initial dictionary.

The invention substantially improves the compression ratio of the first transmission of the set of transmissions.

This is achieved by exchanging packet information in order for it to be known by both transmitter and receiver so that they can initialize their initial compression dictionary with this shared information before performing the transmissions of the set (i.e. including the first transmission). In the above particular case of SPDY, this may be understood through the following example: prior to exchanging compressed HTTP headers, the client and server exchange information relating to the headers they specifically often use.

Packet information that are generally used by the transmitter or the receiver and not listed in a by-default compression dictionary may then be inserted in the initial compression dictionary before compressing data packets for the first transmission. The invention thus uses a more efficient initial compression dictionary since it is specifically adapted to the transmitter and receiver considered (or client and server as the case may be).

Thanks to the exchange, both the transmitter and the receiver are aware of new packet information (whether it is provided by the transmitter or the receiver) and thus compression of that information is performed right from the first transmission, which is only possible in SPDY for subsequent transmissions.

While the above presentation of the invention relates to an initial Deflate compression dictionary, the invention may also apply to any other kind of initial compression dictionary, including a compression dictionary that provides encoding indexes to data to compress (i.e. an initial indexing dictionary).

According to a second aspect of the invention there is provided a method of communicating data packets in a set of transmissions between a transmitter and a receiver of a communications network, the method comprising:

exchanging transmitter-provided packet information and receiver-provided packet information between the transmitter and the receiver, before the set of transmissions;

generating an initial compression dictionary based on the exchanged transmitter-provided packet information and the exchanged receiver-provided packet information;

at the receiver, receiving, through the set of transmissions, compressed data packets from the transmitter via the communications network, and decompressing the compressed data packets received in the set of transmissions, using the initial compression dictionary.

This method provides advantages similar to the above method, but at the receiver.

It will become apparent from the disclosure below that a network device can embed both functions: transmitter and receiver, such that a device can implement both of the above methods.

In one embodiment of the invention, generating the initial compression dictionary comprises concatenating transmitter-provided and receiver-provided compression dictionaries. In this situation, the transmitter-provided and receiver-provided packet information is all or part of compression dictionaries respectively local to the transmitter and to the receiver.

In another embodiment, the transmitter and the receiver generate the same initial compression dictionaries for their respective first data packet transmission from themselves in the set. Of course the initial compression dictionary is used by the transmitter to compress data before sending them, while the receiver uses the same initial compression dictionary to decompress those sent compressed data after reception. The above provision specifies that the receiver also generates the same initial compression dictionary for its first transmission, which is generally a response (e.g. an HTTP response) to the first message from the transmitter (e.g. a HTTP request).

In one embodiment, the exchanged packet information comprises a private part and a shared part of a dictionary local to the transmitter or the receiver providing the packet information.

In particular, the transmitter or receiver generates, for the first transmission of the set from itself, an initial compression dictionary using the private and shared parts of its local dictionary and the exchanged shared part of the other's local dictionary.

Reciprocally, the transmitter or receiver generates, for the first transmission of the set from the other, an initial compression dictionary using the shared part of its local dictionary and the exchanged private and shared parts of the other's local dictionary.

These provisions make it possible to specialize the compression dictionaries used for each communication direction (e.g. a dictionary specific to HTTP requests from a client to a server and a dictionary specific to HTTP responses from the server to the client). In this situation, the transmitter and the receiver use different initial compression dictionaries for their respective first data packet transmission from themselves.

In another embodiment of the invention, generating the initial compression dictionary is also based on a predefined compression dictionary known by both the transmitter and the receiver. This predefined or "static" compression dictionary may advantageously define packet information that is common to many or all network nodes implementing the invention. Indeed, in that case, since this packet information is useful, exchanging it through the transmitter-provided or receiver-provided packet information is advantageously avoided.

Such a static dictionary may for example be the initial compression dictionary defined by the SPDY specification.

In yet another embodiment of the invention, the initial compression dictionary depends on a URL pattern included in the data packet to be transmitted in a transmission of the set, in particular in the first transmission of the set. Generally, the URL pattern matches a URL defined in the data packet. Thanks to this provision, more efficient initial compression dictionaries may be used, resulting in higher compression starting from the first transmission in the set. For example, a dictionary specialized with data about HTTP headers relating to images may be used when compressing data packets including the URL of a directory of images. And a dictionary specialized with HTTP headers relating to digital documents may be used when compressing data packets including the URL of a directory of digital documents.

In particular, the exchanged transmitter-provided packet information and receiver-provided packet information (and possibly also the predefined compression dictionary) are specific to the URL pattern.

In one embodiment of the invention, the transmitter-provided and receiver-provided packet information comprises respective version numbers.

In particular, the method may further comprise exchanging the version numbers between the transmitter and the receiver, and checking the exchanged version numbers with version numbers associated with an already-generated initial compression dictionary. Of course, version numbers can be implemented independently for the above mentioned private and shared parts of local dictionaries.

Thanks to these provisions, the exchange of some transmitter-provided packet information and receiver-provided packet information may be avoided. This is because, by checking the version numbers, only the packet information whose version numbers differ between the transmitter and the receiver have to be sent. This reduces the network load.

In another embodiment of the invention, the set of transmissions belongs to the same connection over the communications network between the transmitter and the receiver. A connection between two network devices, as a TCP connection, is the result of a negotiated allocation of resources by both devices to make it possible for them to communicate with each other. The present invention is particularly advantageous for the first transmissions (i.e. the first transmission from a first device to a second device, and the first transmission from the second device to the first device) of a given connection.

According to a particular feature, exchanging the transmitter-provided and receiver-provided packet information is performed prior to establishing the connection to which the set of transmissions belongs. This is for example the case when the exchange occurs during a previous connection. The advantage of this configuration is that the exchange may be substantially transparent to the communicating devices. In particular, the transmitter-provided and receiver-provided packet information may be exchanged in periods of no data packet transmission during a first connection between the transmitter and the receiver prior to the connection to which said set of transmissions belongs. Here, the invention takes advantage of the unused transmission time of the first connection to transparently exchange the packet information. This avoids planning a specific time period for packet information exchange that would delay the transmissions of the data packets.

According to another particular feature, an initial compression dictionary is obtained for each new connection between the transmitter and the receiver, and the initial compression dictionary of a connection evolves with the compression of data packets for the set of transmissions of that connection.

In yet another embodiment of the invention, the transmitter-provided and receiver-provided packet information is not compressed when exchanged. This is because they are used to generate the initial compression dictionary, and thus could not be decompressed without that dictionary.

In a particular application of the invention, the transmitter-provided packet information and the receiver-provided packet information comprise data relating to HTTP header contents, and compressing the data packets comprises compressing HTTP headers of the data packets using the initial compression dictionary.

In particular, the transmitter and the receiver form a client-server scheme.

According to a third aspect of the invention there is provided a network device for communicating with a remote network device of a communications network, through a set of transmissions of data packets, the network device comprising:

an exchange module for exchanging, with the remote network device and before the set of transmissions, local packet information and remote-device-provided packet information;

generation means for generating an initial compression dictionary based on the exchanged local and remote-device-provided packet information;

a compressor for compressing the data packets of the set of transmissions using the initial compression dictionary; and a communication module for sending, through the set of transmissions, the compressed data packets over the communications network to the remote network device.

According to a fourth aspect of the invention there is provided a network device for communicating with a remote network device of a communications network, through a set of transmissions of data packets, the network device comprising:

an exchange module for exchanging, with the remote network device and before the set of transmissions, local packet information and remote-device-provided packet information;

generation means for generating an initial compression dictionary based on the exchanged local and remote-device-provided packet information;

a communication module for receiving, through the set of transmissions, compressed data packets from the remote network device via the communications network; and a decompressor for decompressing the compressed data packets received in the set of transmissions, using the initial compression dictionary.

According to a fifth aspect of the invention there is provided a network system comprising two network devices as defined above communicating together.

Another aspect of the invention relates to a computer program product for a programmable apparatus, the computer program product comprising a sequence of instructions for carrying out one of the methods as set out above when loaded into and executed by the programmable apparatus.

Yet another aspect of the invention relates to a non-transitory computer-readable storage medium, able to be read by a programmable apparatus, storing instructions of a computer program for carrying out one of the methods as set out above when loaded into and executed by the programmable apparatus.

The network devices, the network system, the computer program product and the computer-readable storage medium may have features and advantages that are analogous to those set out above and below in relation to the methods of communicating, in particular that of improving the compression ratio of the first transmission (in each communication direction) in a set of transmissions.

Another aspect of the invention relates to a method of communicating substantially as herein described with reference to, and as shown in, FIG. 6; FIGS. 6 and 7; FIGS. 6, 7 and 8; FIGS. 6 and 8; FIGS. 6 and 10 of the accompanying drawings.

Optional features of the invention are further defined in the dependent appended claims.

At least parts of the method according to the invention may be computer implemented. Accordingly, the present invention may take the form of an entirely hardware embodiment, an entirely software embodiment (including firmware, resident software, micro-code, etc.) or an embodiment combining software and hardware aspects which may all generally be referred to herein as a "circuit", "module" or "system". Furthermore, the present invention may take the form of a computer program product embodied in any tangible medium of expression having computer usable program code embodied in the medium.

Since the present invention can be implemented in software, the present invention can be embodied as computer readable code for provision to a programmable apparatus on any suitable carrier medium, for example a tangible carrier medium or a transient carrier medium. A tangible carrier medium may comprise a storage medium such as a floppy disk, a CD-ROM, a hard disk drive, a magnetic tape device or a solid state memory device and the like. A transient carrier medium may include a signal such as an electrical signal, an electronic signal, an optical signal, an acoustic signal, a magnetic signal or an electromagnetic signal, e.g. a microwave or RF signal.

Embodiments of the invention will now be described, by way of example only, and with reference to the following drawings in which:

FIG. 1 illustrates six HTTP headers and a SPDY initial compression dictionary of the prior art;

FIG. 2 is a block diagram illustrating components of a processing device in which embodiments of the invention may be implemented;

FIG. 3 illustrates a first example of implementation of the invention;

Figure 4:
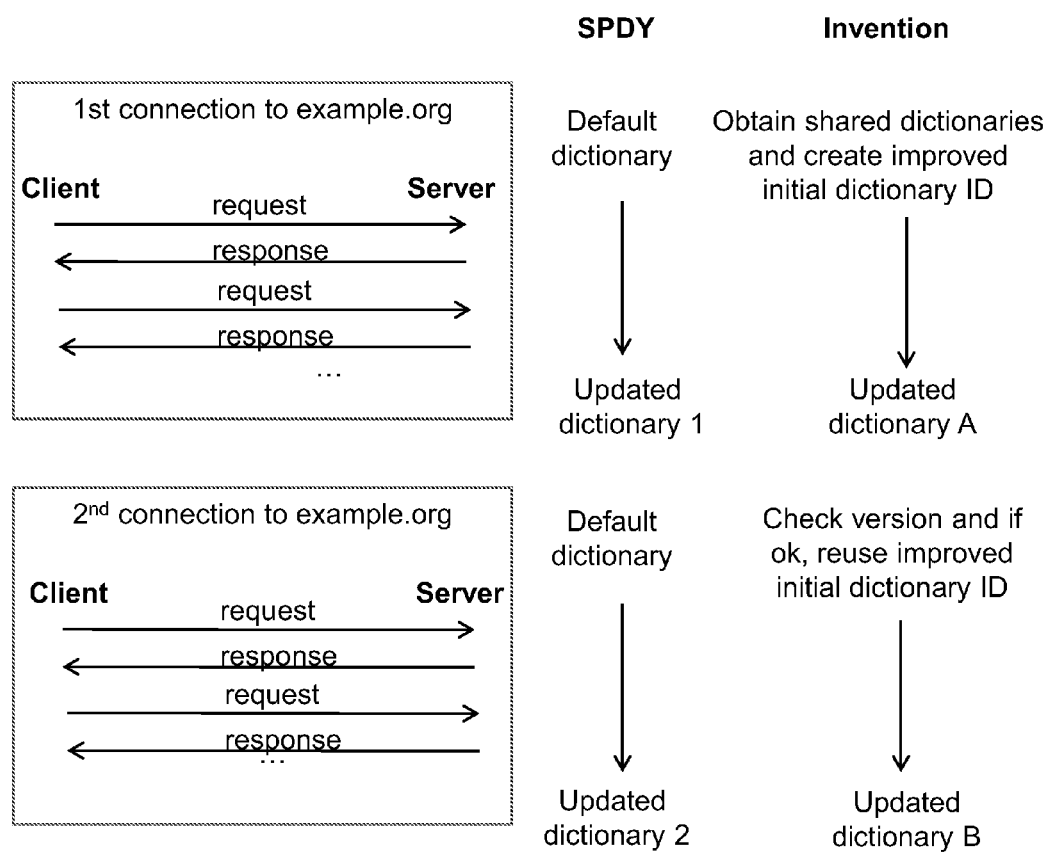
Figure 5:
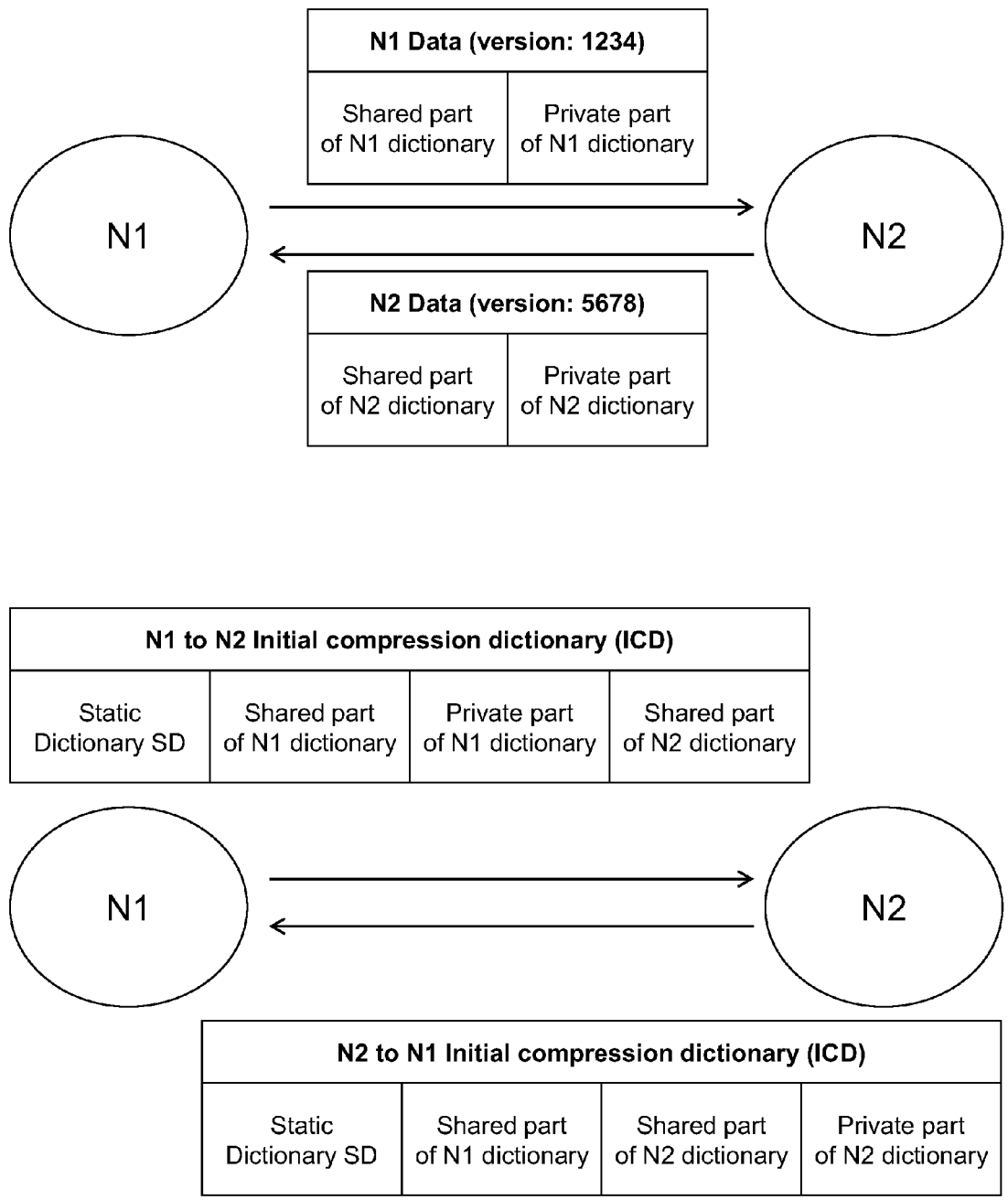
Figure 6:
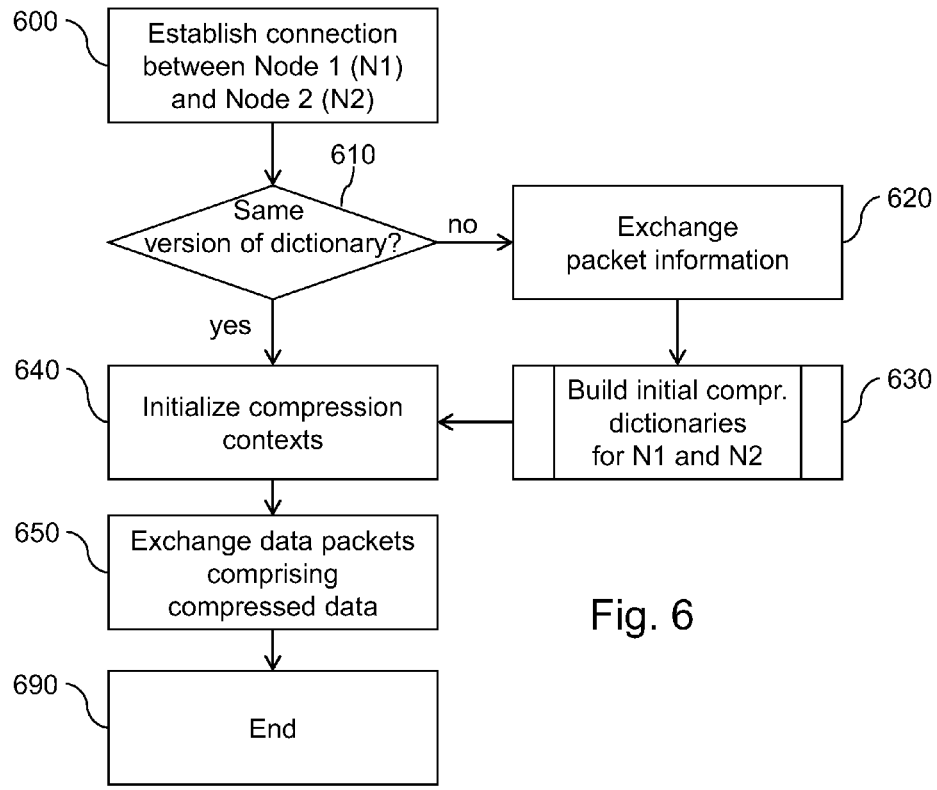
Figure 8:
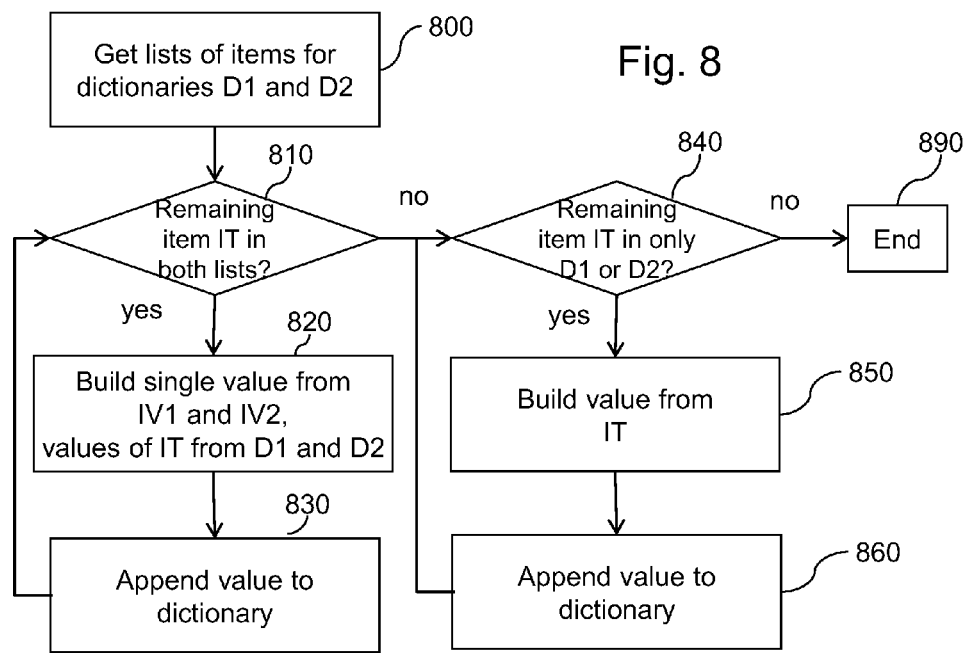
Figure 7:
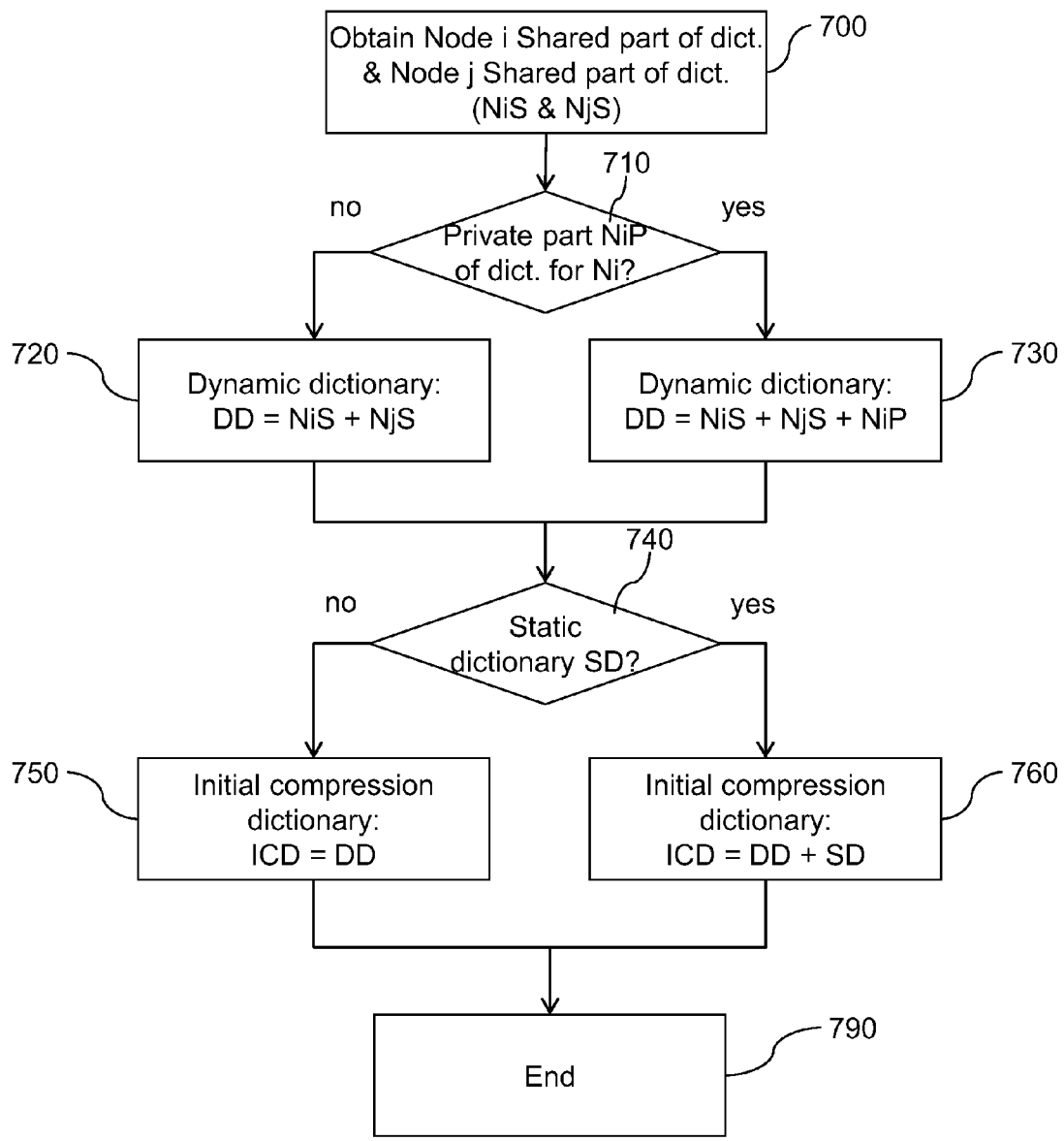
Figure 10:
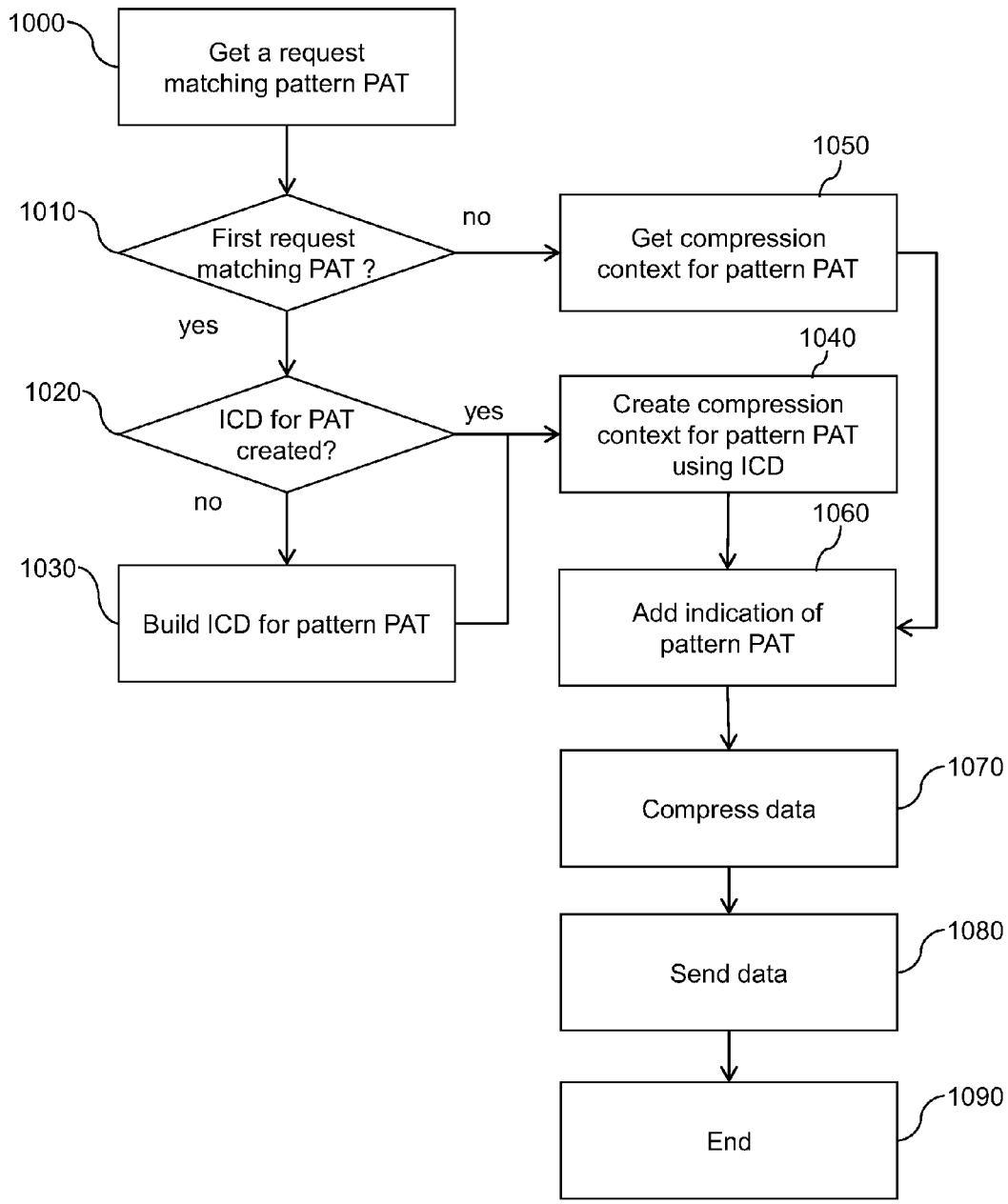

FIG. 4 compares the implementation of FIG. 3 with the conventional SPDY protocol;

FIG. 5 illustrates another example of implementation of the invention, based on private and shared parts of dictionaries local to the nodes;

FIG. 6 is a flowchart illustrating exchanges of data packets using dictionaries, according to embodiments of the invention;

FIG. 7 is a flowchart illustrating the building of an initial compression dictionary for Ni to Nj transmissions, according to embodiments of the invention;

FIG. 8 is a flowchart illustrating the addition of structured dictionaries, according to embodiments of the invention;

FIG. 9 represents two XML-structured dictionaries having private and shared parts, to implement embodiments of the invention; and FIG. 10 illustrates, in a flow chart, an embodiment of the invention handling URL patterns.

FIG. 2 schematically illustrates a processing device 200, either a transmitter, or a receiver, or a device embedding both functionalities, configured to implement at least one embodiment of the present invention. The processing device 200 may be a device such as a micro-computer, a workstation or a light portable device. The device 200 comprises a communication bus 213 to which there are preferably connected:

central processing unit 211, such as a microprocessor, denoted CPU;

a read only memory 207, denoted ROM, for storing computer programs for implementing the invention;

a random access memory 212, denoted RAM, for storing the executable code of the method of embodiments of the invention as well as the registers adapted to record variables and parameters necessary for implementing methods of communicating according to embodiments of the invention; and a communication interface 202 connected to a communications network 203 over which digital data to be processed are transmitted.

Optionally, the apparatus 200 may also include the following components:

a data storage means 204 such as a hard disk, for storing computer programs for implementing methods of one or more embodiments of the invention and data used or produced during the implementation of one or more embodiments of the invention;

a disk drive 205 for a disk 206, the disk drive being adapted to read data from the disk 206 or to write data onto said disk;

a screen 209 for displaying data and/or serving as a graphical interface with the user, by means of a keyboard 210 or any other pointing means.

The apparatus 200 can be connected to various peripherals, such as for example a digital camera 200 or a microphone 208, each being connected to an input/output card (not shown) so as to supply multimedia data to the apparatus 200.

The communication bus provides communication and interoperability between the various elements included in the apparatus 200 or connected to it. The representation of the bus is not limiting and in particular the central processing unit is operable to communicate instructions to any element of the apparatus 200 directly or by means of another element of the apparatus 200.

The disk 206 can be replaced by any information medium such as for example a compact disk (CD-ROM), rewritable or not, a ZIP disk or a memory card and, in general terms, by an information storage means that can be read by a microcomputer or by a microprocessor, integrated or not into the apparatus, possibly removable and adapted to store one or more programs whose execution enables the method of communicating according to the invention to be implemented.

The executable code may be stored either in read only memory 207, on the hard disk 204 or on a removable digital medium such as for example a disk 206 as described previously. According to a variant, the executable code of the programs can be received by means of the communication network 203, via the interface 202, in order to be stored in one of the storage means of the apparatus 200, such as the hard disk 204, before being executed.

The central processing unit 211 is adapted to control and direct the execution of the instructions or portions of software code of the program or programs according to the invention, which instructions are stored in one of the aforementioned storage means. On powering up, the program or programs that are stored in a non-volatile memory, for example on the hard disk 204 or in the read only memory 207, are transferred into the random access memory 212, which then contains the executable code of the program or programs, as well as registers for storing the variables and parameters necessary for implementing the invention.

In this embodiment, the apparatus is a programmable apparatus which uses software to implement the invention. However, alternatively, the present invention may be implemented in hardware (for example, in the form of an Application Specific Integrated Circuit or ASIC).

FIG. 3 illustrates a first example of implementation of the invention, based on a SPDY approach.

Two network devices, represented by the nodes N1 and N2, belong to the same communications network and intend to communicate by exchanging data packets (e.g. using SPDY protocol). Each node may keep up to date a local dictionary comprising packet information the node often uses. This may be for example the HTTP headers (name and/or values) it often uses. Each node is also aware of a by-default or "static" dictionary SD that is common to all nodes of the communications network (for example the initial compression dictionary defined by the SPDY specification) and which also lists packet information. These dictionaries may have been produced according to the SPDY format illustrated in FIG. 1, i.e. Deflate compression dictionaries. However, in a variant, there may be indexing dictionaries providing an index for data to encode or compress. Of course, use of both Deflate compression dictionary and indexing dictionary together may be contemplated within the scope of the invention. Below, reference is preferably made to the use only of a Deflate compression dictionary.

Prior to exchanging data packets, a connection is established between nodes N1 and N2, typically using TCP transport protocol on which HTTP and SPDY rely. As defined by SPDY, a plurality of transmissions (requests/responses) defining a set of transmission will occur during that TCP connection.

Upon establishing the connection, node N1 shares its local dictionary with N2, sending it to N2. Reciprocally, N2 also shares its dictionary by sending it to N1. In this Figure, the exchanged packet information are those dictionaries with version information, enabling each of N1 and N2 to check, later on if needed, that they have the same versions as the current dictionaries.

These dictionaries are named "shared dictionaries" because they are used by both N1 and N2 to build their initial compression dictionary for transmitting data packets (i.e. by N1 to N2, and reciprocally by N2 to N1). It is to be noted that a similar initial compression dictionary is built by each node N1 or N2 to be able to decompress a data packet received from the other node. In this respect, in each node N1 or N2, there may be provided an initial compression dictionary for decompressing data packets received from the other node and an initial compression dictionary for compressing data packets to be sent to the other node. These dictionaries however evolve in a different manner as data packets are compressed (because different information may be used in data received and transmitted by the same node, resulting in a different evolution of the dictionaries).

In another implementation, each node N1 or N2 may have only one initial compression dictionary which is the same as that of the other node. In that case, the same compression dictionary is used whether the corresponding node receives (decompresses) or sends (compresses) data packets, meaning that the same initial compression dictionary evolves in the same way during compression and decompression at both nodes. The advantage of this approach comes from its simplicity: only one initial compression dictionary is built by N1 and only one initial compression dictionary (the same one) is built by N2.

While in the example of FIG. 3 the two initial compression dictionaries of the same node are initially similar (i.e. before evolving due to the actual compression of data packets), there exist other implementations of the invention according to which they are different.

This is because more efficient compression can be achieved by providing two distinct initial compression dictionaries: one for the data packets encoded by N1 (sent to N2), and one for the data packets encoded by N2 (sent to N1). Indeed, each initial compression dictionary is better adapted to the properties of the data packets sent by its respective node than a single initial compression dictionary used by both N1 and N2 to compress the data packets. To use the distinct initial compression dictionaries, each of N1 and N2 has to build both initial compression dictionaries (one for decompressing received data packets, and the other one for compressing data packets to send).

An illustration of such another implementation is provided below with reference to FIG. 5.

The building of each initial compression dictionary ICD in FIG. 3 is made similarly by N1 and N2: it consists in concatenating N1 shared dictionary with N2 shared dictionary.

In the example of the Figure, the static dictionary is also concatenated to N1 and N2 shared dictionaries. Defining such a static dictionary appears to be useful when it can be assumed that some dictionary data representing packet information would be common to all the nodes implementing the invention. Indeed, since such data or packet information is assumed to always be useful, defining it as a static dictionary avoids having to exchange this data or packet information with the exchanged shared dictionaries.

Based on the built initial compression dictionaries ICD at N1 and N2, data packets are compressed by each transmitter and then sent, and decompressed by each receiver.

Thanks to these initial compression dictionaries, which are specific to the considered nodes N1 and N2, the compression (during the current connection) of the first packet of data transmitted from N1 to N2 is made more efficient. Similarly, the compression of the first packet of data transmitted from N2 to N1 is made more efficient.

This is because N1 and N2 know which kind of packet data they send, and so they can provide efficient packet information to the other.

Where HTTP headers are exchanged, client and server know which headers they send, as well as their possible values. Therefore, the resulting initial compression dictionary made by sharing such packet information, is made more efficient for compressing HTTP headers than SPDY's by-default dictionary.

In this first example of FIG. 3, a main difference with SPDY comes from the fact that instead of using only a static dictionary which does not depend on the considered communicating nodes involved in the current connection (client and server), an initial compression dictionary based on packet information shared by the client and server is used. In this example, the shared packet information does not come only from the client or the server, but from both nodes. However, it may come from only one of the two nodes involved.

FIG. 4 illustrates a comparison of the invention with SPDY.

When a first TCP/IP connection is established between a client and the server 'example.org', SPDY uses its by-default initial compression dictionary. Various exchanges of data packets are then made using data compression based on that initial compression dictionary, and that dictionary is progressively updated by Zlib Deflate (the same happens at the receiver to keep the dictionary synchronized). The TCP/IP connection ends and, later on, a second TCP/IP connection is established between the same two nodes. For this second connection, SPDY also uses the by-default initial compression dictionary to compress new data packets.

With the invention, a new initial compression dictionary is created based on shared dictionaries which are exchanged between the client and server when the first TCP/IP connection is made. This initial compression dictionary is updated by Zlib Deflate while data packets are being compressed. When a second connection occurs, the new initial compression dictionary based on shared dictionaries is used again, provided that the versions of the shared dictionaries are the same. Therefore, for the first request and response of each connection, improved compression is obtained.

A main advantage of the invention thus concerns the gain in compression obtained for the first exchange of data packets between the nodes N1 and N2. In the above example, that gain in compression is achieved on the encoding of the first request's headers by N1 and on the first response's headers by N2.

In addition, the invention is easily integrated into SPDY. This is because it is only necessary to modify the initial compression dictionary of SPDY to implement the invention. Once this modified initial compression dictionary has been used by client and server to initialize Zlib Deflate encoders and decoders, SPDY then operates exactly as usual.

It may be noted that for the next requests and responses of each connection, the compression ratio is generally very similar between the invention and SPDY. This is because the majority of useful packet information is added to the dictionary (i.e. during the updating) during the processing of the first request or response.

In some cases, the shared dictionaries may however provide packet information used only in subsequent transmissions within the TCP/IP connection. In this situation, the invention thus also improves the compression ratio of such subsequent transmissions.

The above version information specified in the shared dictionaries may be used to further improve the compression gains. Indeed, in some cases, the cost for exchanging N1 and N2 shared dictionaries is not significantly smaller than the compression gain provided by the improved initial compression dictionary.

To further improve the compression, these N1 and N2 shared dictionaries are stored by each node N1 or N2 along with the corresponding version information. Then when initializing each new connection between N1 and N2 (as illustrated in FIG. 4 with the second connection), N1 and N2 simply check that they are storing the same version of the shared dictionaries, instead of always exchanging the shared dictionaries. The cost of this operation, in terms of bandwidth, is much smaller than always exchanging shared dictionaries: only version information is exchanged in most of cases.

This results for the second connection in a compression gain that is much more significant. As many connections are made, the overall gain also increases.

FIG. 5 illustrates another example of implementation of the invention, which example supports the possibility, for the communicating nodes, of having different initial compression dictionaries for their transmissions. In other words, the initial compression dictionary used by N1 to send data packets to N2 is different from the initial compression dictionary used by N2 to send data packets to N1. Of course, the initial compression dictionary used by any receiving node to decompress received data packets is the same as the initial compression dictionary used by the transmitter to compress the data packets before they are sent.

In the example of FIG. 5, the kept-up-to-date local dictionary of each node comprises at least one private part and one shared part (below FIG. 9 illustrates examples of structured dictionaries with private and shared parts). Of course, the following explanations still apply when only some of the nodes implements a private part of the local dictionary, for example N1 may have both a private part and a shared part, while N2 only has a shared dictionary (i.e. without a private part).

The private part stores packet information that is considered as very specific to the node (let's say N1), i.e. often used by that node when transmitting a data packet. It may be packet information only used in the communication direction N1 to N2: for example it may be HTTP header information (name and/or values) relating only to HTTP requests (N1 acting as a web client), while N2 (web server) will store the HTTP header information relating only to HTTP requests in the private part of its local dictionary.

The shared part stores packet information that is considered specific to the pair of communicating nodes (here N1 and N2), in which case such information should be used in both communication directions N1 to N2 and N2 to N1.

When exchanging packet information (i.e. dictionary data), each node N1 or N2 sends both the shared part of the local dictionary (as previously explained and illustrated above with reference to FIG. 3) and the private part of the local dictionary, to the other node N2 or N1.

While the exchanged shared parts are used to build the initial compression dictionaries for the compression of both N1 to N2 messages and N2 to N1 messages, the private part of N1's local dictionary is used for the initial compression dictionary of N1 to N2 messages (i.e. N1 uses it to build its initial compression dictionary for compressing and sending data packets to N2, while N2 uses it to build its initial compression dictionary only for decompressing the compressed data packets received from N1). Conversely, the private part of N2's local dictionary is used for the initial compression dictionary of N2 to N1 messages: N2 uses it to build its initial compression dictionary for compressing and sending data packets to N1, while N1 uses it to build its initial compression dictionary only for decompressing the compressed data packets received from N2.

In this configuration of FIG. 5, the private part of N1's local dictionary (respectively N2) is considered to bring a compression advantage only for the compression of N1 data (respectively N2), whereas the shared part of N1's local dictionary (respectively N2) is considered to bring a compression advantage for the compression of both N1 data and N2 data.

As illustrated in FIG. 5, the static dictionary SD may also be used to build the initial compression dictionaries ICD as discussed above with reference to FIG. 3. This results in having an N1-to-N2 initial compression dictionary made of the static dictionary, the private and shared parts of N1's local dictionary and the shared part of N2's local dictionary; and in having an N2-to-N1 initial compression dictionary made of the static dictionary, the shared part of N1's local dictionary and the private and shared parts of N2's local dictionary.

Based on these built initial compression dictionaries, N1 and N2 can efficiently (i.e. with a good compression ratio) communicate right from the first transmission in the current connection.

FIG. 6 is a flowchart illustrating exchanges of data packets using dictionaries according to the invention.

The process starts at step 600 where a connection is established between a first node N1 and a second node N2 of a communications network. Typically, this connection can be a TCP/IP connection.

Next, step 610 checks whether or not N1 and N2 have the same version of their respective shared dictionaries. This check occurs before exchanging the data packets (see step 650 below).

This check may be done by exchanging two messages between N1 and N2.

For instance, N1 sends a first message comprising the version information associated with its local dictionary (two values can be provided in the case of a private part and a shared part of that local dictionary) and associated with the dictionary of N2 that N1 stores (if any received during a previous exchange of packet information). Then, N2 compares the received version information with its stored version information, and return the result of this comparison. By doing so, both N1 and N2 know whether or not they have the same version of their respective dictionaries.

Of course, other implementations of step 610 can be used. For example, each of N1 and N2 sends the version information of its local dictionary to the other node. Then that other node locally compares the received version information with the shared dictionary it locally stores, and returns the result of this comparison.

If N1 and N2 do not have the same version of their respective dictionaries (this is for example the case when N1 and N2 have no information about the other node's dictionary), the process goes on through step 620 where the missing packet information (i.e. the shared dictionary having a wrong version) is exchanged between the two nodes, as shown by the arrows in FIGS. 3 and 5. The packet information may be sent un-compressed, or compressed using a compression dictionary other than the one concerned by this packet information.

N1 sends its local dictionary to N2 (along with version information, typically a version number), and N2 sends its local dictionary to N1 (along with version information).

Refined exchanges may be implemented to reduce the network load. For example, where it has been determined at step 610 that either N1's local dictionary or N2's local dictionary is already known by the other node with the same version, only the missing data are sent to that other node: for example only N1's local dictionary is sent to N2 if N1 has the right version of N2's local dictionary.

Further to step 620, step 630 consists in building the initial compression dictionaries ICD at N1 and N2. Further details about that step 630 are given below with reference to FIG. 7.

Further to step 630 or if it is determined at step 610 that N1 and N2 has the same versions of the dictionaries, the compression contexts for N1 and N2 are initialized at step 640.

For example, the initialization of a compression context may consist in providing an initial compression dictionary (as built in step 630 for instance) to a compressor or to a decompressor, when appropriate. Initialization is made at least for one compressor (e.g. N1 if N1 sends data to N2) and one decompressor (e.g. N2 if N1 sends data to N2). If both N1 and N2 send data using compression to the other node, then N1 and N2 both have a compressor and a decompressor, and then corresponding compression contexts.

Further to context initialization step 640, data packets are compressed and then exchanged between N1 and N2 at step 650.

The compressed data may in some embodiments be only part of the data packets, as in the case of SPDY where the compression contexts are used only for the compression/decompression of HTTP headers.

Next to step 650, the process ends at step 690.

This process is repeated at each new connection for communicating between N1 and N2. One may note that the exchange 620 of packet information is bound to occur at the first connection, resulting in a step 620 that is liable to delay (given the amount of packet information to exchange) the transmission 650 of data packets.

In order to make the process faster, one particular implementation of the invention provides for the packet information to be exchanged in periods of no data packet transmission during the very first connection between the two nodes.

This means that the packet information (i.e. the dictionaries) is exchanged in parallel of the exchange of data packets during the first connection, typically when no data is being exchanged between N1 and N2.

Then, when a second connection between N1 and N2 occurs, the invention can be applied by checking for the versions and using the dictionaries previously exchanged provided they have not changed.

In another implementation of the invention, the check 610 of dictionary version information may be delayed after exchanging a first data packet 650, thus allowing an earlier start of data packet exchange between N1 and N2. This implementation relies on assuming that both nodes have the same version of the dictionaries.

In this situation step 600 of the node that encodes the data packets (let's assume it is N1) is directly followed by step 640. Furthermore, the version information of each dictionary is indicated in the data packet sent at step 650 (this indication being not compressed using the dictionary, otherwise the other node N2 would not be able to decode it correctly if it has another version of the dictionary).

When the receiving node N2 receives the data packet, it checks whether the versions are the ones it expects (i.e. the versions of the dictionaries it stores).

If both N1 and N2 dictionary versions are the expected ones, then the data packet can be decompressed, and further data packets can also be encoded by N2 to be sent to N1.

If the N1 or N2 dictionary version is not the expected one, then the data packet cannot be decompressed as the initial compression dictionary may be different in N1 and N2. In that situation, N2 generates an error to be sent to N1, or sends a specific message requesting the dictionary exchange (thus triggering step 620).

It may be understood that, by using the private and shared parts of the local dictionaries, two pieces of version information are provided, respectively for the private part and the shared part. This makes it possible to optimize the exchange of packet information when needed. For example, if only the private part of N2's local dictionary has been modified when a data packet from N1 is received, then the data packet can be correctly decompressed by N2 since N1's dictionary has not changed, and the shared part of N2's dictionary has not changed either. In such a case, N2 adds an indication about the new private part of its local dictionary inside the next message sent to N1, so that N1 knows it has to obtain this new private part (in a variant, the new private part may even be automatically sent to N1).

Based on the exchanged packet information, i.e. the local dictionaries (private and shared parts) in the examples above, an initial compression dictionary ICD is built. As explained above, the same initial compression dictionary may be obtained for the N1 to N2 transmissions and for the N2 to N1 transmissions. In another scheme, different initial compression dictionaries are used for the two directions of transmission.

The building of the initial compression dictionary for Ni to Nj transmissions is now described with reference to FIG. 7.

The building of Ni to Nj initial compression dictionary ICD starts at step 700 by obtaining the shared parts of Ni and Nj dictionaries, denoted respectively NiS and NjS.

Next, step 710 checks whether or not Ni has a private part NiP in its local dictionary. If not, step 710 is followed by step 720, where a dynamic dictionary DD is defined as the addition of NiS and NjS.

The addition of dictionaries may be seen as grouping all the entries of the dictionaries into a single resulting dictionary. However, other implementations may be used, for example the intersection of dictionaries rather than grouping the entries.

Where each dictionary is a string concatenating the entries, the addition of dictionaries can be defined as a concatenation of said strings.

If the dictionaries have a more complex structure, such as the one illustrated in FIG. 9 where dictionaries are XML documents, the definition of the addition may be more complex. An example of such addition is described below with reference to FIG. 8.

On the other hand, if Ni has a private part NiP in its local dictionary, step 710 is followed by step 730, where the dynamic dictionary DD is defined as the addition of NiS, NjS and NiP.

Once the dynamic dictionary DD is defined, step 740 determines whether or not a static dictionary SD is available. The availability of such a dictionary is only an implementation decision: if it can be known that some packet information is likely to be common to all the dictionaries of the nodes implementing the invention, then this packet information can be used as a static dictionary. Defining such a static dictionary enables the amount of packet information exchanged by nodes Ni and Nj at step 620 to be limited. This is because the local dictionaries are optimized by not storing packet information already present in the static dictionary.

If there is no static dictionary SD, the initial compression dictionary ICD is defined by the dynamic dictionary DD at step 750.

If there is a static dictionary SD, the initial compression dictionary ICD is defined as the addition of the dynamic dictionary DD and the static dictionary SD, at step 760.

Next to step 750 or 760, the process ends at step 790.

Of course, when the local dictionaries do not implement a private part, step 700 is directly followed by step 720, avoiding steps 710 and 730. Similarly, when it is known that there is no static dictionary, step 720 (or 730) is directly followed by step 750, avoiding steps 740 and 760.

FIG. 8 illustrates the addition of structured dictionaries, i.e. a list of structured items, denoted D1 and D2. It is considered that each item comprises a name and a value.

As shown above it may be the addition of NiS to NjS, of NiS to NjS and to NiP, of SD to DD.

At step 800, two lists of items, one for dictionary D1 and one for dictionary D2, are obtained. Then, at step 810, it is determined whether there remains an item IT present in both lists, which means that two items IT1 and IT2, coming from D1 and D2, have the same name IN.

In particular, the items of D1 and D2 may be processed in a predetermined order (for instance, the order of the items in the list), said order allowing the definition of a more efficient dictionary.

If so, a single value is computed or built from IV1 and IV2, the values of the two items IT1 and IT2, at step 820.

For example, if each of IV1 and IV2 contains a list of strings as illustrated in FIG. 9, the building of a single value from IV1 and IV2 may consist in determining the intersection of those two lists of strings, and then in concatenating the strings forming the intersection.

Another strategy may be to compute the union of the strings instead of the intersection.

In some cases, it may be advantageous to compute the intersection for some items, and the union for others.

Yet another strategy may rely on selecting strings based on the presence of others strings, possibly in other items (including items having a different name). Such selection (related to other items) may be applied to items present only in D1 or D2. For example, items may specify a content language. Thus when compressing data packets to send images, content language items may be discarded from selection since they are useless.

At step 830, the value built at step 820 is appended to the corresponding item in the dictionary to be provided as a result of the addition process.

At step 810, if there is no remaining item IT1 and IT2 from D1 and D2 such that IT1 and IT2 have the same name, the remaining items present only in D1 or D2 are processed as follows: at step 840, it is determined whether or not there remains an item IT in one of the two lists; if so, a value is built from IT at step 850, generally by concatenating the strings listed in the item IT; then at step 860, this value is appended to the corresponding item in the dictionary to be provided as a result of the addition process.

When there is no remaining item IT at step 840, the process ends at step 890.

In this implementation of the addition process, the building of a value involves an intersection or a union of values defined in items having the same name. In a variant, the intersection or union may be performed on the values associated with items (from the two lists) having different names. For example, when considering the HTTP header terminology, the "Accept" header of the HTTP request (see FIG. 1) is of the same nature as the "Content-Type" header defined in HTTP. In this context, they may be grouped together using the same name "types" (see the example of FIG. 9). Using the same name makes it possible to avoid some ambiguous situations.

Steps of FIG. 8 are further explained with help of the examples of structured dictionaries of FIG. 9. In these examples, the dictionaries local to N1 and N2 are structured XML documents listing possible HTTP headers. Of course, more HTTP headers than shown in the Figure can be added to the dictionaries.

The exchange of packet information between N1 and N2 may consist in exchanging those XML documents.

Each local dictionary comprises a <private> element and a <shared> element to separate the private part and the shared part of the dictionary, as already mentioned above.

The <private> element comprises HTTP header names, possibly with associated values for those headers.

In the example of the N2 dictionary where N2 is an HTTP server, the HTTP header name "server" is included in the private part of the dictionary, along with an associated value/name of the server used, for instance "Apache".

In the example of the N1 dictionary where N1 is a client node, the HTTP header name "user-agent" is included in the private part of the dictionary, along with one or several associated values of the client's user-agent, for instance "Mozilla/5.0", "Gecko/20110303" and "Firefox/3.6.15".

The <shared> element comprises more generic information that is used by both nodes, in particular by the HTTP client and the HTTP server.

In the example of the figure, the shared part of the dictionary comprises a <version> element containing the version of HTTP used ("HTTP/1.1"), a <types> element containing a list of supported data types ("text/html", "image/jpg", "image/gif", etc.), and a <languages> element containing a list of provided languages (for the server) and requested languages (for the client) ("en", "en-us").

Of course, this example is provided for illustrative purposes, such that other and additional elements may be listed in the <private> and <shared> elements.

As explained above with reference to FIG. 8, the building of the shared dictionary from the two N1 and N2 dictionaries comprises computing one string for each of the three children of the <shared> element: i.e. <version>, <types> and <languages>.

For each child, a list of strings is obtained from the associated value in each N1 or N2 dictionary: each value is a list of semi-colon separated strings as shown in the Figure.

The intersection of step 820 between the two lists of strings from the N1 and N2 dictionaries is computed, and the strings comprised in this intersection are concatenated. For example, for the <types> element, the two lists are: text/html;image/jpg;image/gif;image/png (for the N1 dictionary) and text/html;image/jpg;image/gif (for the N2 dictionary). The value obtained at step 820 by intersection and concatenating is: "text/htmlimage/jpgimage/gif".

The intersection approach makes the "image/png" value not appear in the obtained value, although it appears in the N1 dictionary. Using this approach may be justified by the following explanation: considering that N1 is an HTTP client and N2 an HTTP server, the example of FIG. 9 means that the HTTP server (N2) does not expect to provide image/png data. Therefore, it can be assumed that there is no advantage to add "image/png" to the shared dictionary for the HTTP client and the HTTP server, even if the client supports image/png data.

The same argument may be used for languages, protocol version, character encoding, compression method, etc.

More generally, the HTTP header names frequently used by N1 and N2 are advantageously included respectively in server and client dictionaries. When the values of HTTP headers can be known in advance, those values are also added to the dictionaries.

Where there are a private part and a shared part in the dictionaries, the private part preferably contains packet information specific to one node, whereas the shared part contains packet information which is somehow related to both nodes.

In one particular embodiment of the invention, the initial compression dictionary depends on a URL pattern included in the data packet to be transmitted in the first transmission. This makes it possible to obtain an initial compression dictionary which is specific to the data packet to be transmitted, and then which provides an improved compression of that packet.

For example, an HTTP server "example.org" provides access to resources accessible through a Uniform Resource Locator (URL). For instance, an image "sample.jpg" is accessible through the URL "http://www.example.org/images/sample.jpg", and a digital document "doc.html" is accessible through the URL "http://www.example.org/docs/doc.html".

In the HTTP server, the images are stored in an images directory and the documents are stored in a documents directory.

This organization of the data through separate directories offers different advantages.

In particular, different parameters can be applied to the HTTP server for the different directories: the images directory can be served statically (i.e. each image resource that is requested is directly obtained from a static file), while the documents directory can be served dynamically (i.e. the document resource that is requested is not directly available as a file, but is instead generated upon request).

This organization based on URL patterns (i.e. the URL defining the directories) reflects differences in data content. Since the HTTP headers comprise the type of the data exchanged (see FIG. 9 for example): "images/jpeg", "images/gif" or "images/png" for the images, and "text/html" or "text/xml" for the documents, there is an interest in distinguishing various compression dictionaries for some of the considered URL patterns. To be precise regarding the above example, two initial compression dictionaries may be considered, one related to the images directory (yet including "images/jpeg", "images/gif" or "images/png") and the other one to the documents directory (yet including "text/html" or "text/xml").

By selecting the appropriate packet information for each initial compression dictionary, better compression is therefore achieved.

FIG. 10 illustrates, in a flow chart, such an embodiment of the invention handling URL patterns. While the explanations below are based on processing a request at a first node, similar steps may be implemented when processing a response at the other node.

This process starts at step 1000 by obtaining a request matching pattern PAT. This pattern is for example specified in the first request of the current connection to be transmitted or received (depending the node considered).

For example, this may be a whole URL specified in the request or a part of that URL that matches with pre-defined URL patterns. In the case of a request URL matching several patterns (for instance, http://www.example.org/images/jpeg/sample.jpg matches both http://www.example.org/images/ and http://www.example.org/images/jpeg/), the most specific match (in this example, the last one) is preferably considered.

Next, step 1010 checks whether or not this is the first request matching pattern PAT for the current connection (i.e. whether or not that pattern PAT has already been encountered during the current connection). In this respect, a counter or a flag may be provided in the node so that it is incremented each time a request matching pattern PAT is obtained.

If it is the first PAT, step 1020 further checks whether or not an initial compression dictionary for that pattern PAT has already been created and is available. Availability may take into account version information of the initial compression dictionary compared to version information of packet information specific to that pattern PAT.

Indeed, even if this is the first request matching pattern PAT for the current connection, another one may have been processed in a previous connection, and the corresponding initial compression dictionary may have already been created and stored.

If the initial compression dictionary has not already been created, it is built at step 1030. Of course, various initial compression dictionaries related to various patterns PAT may have been created in advance, such that step 1030 comes down to selecting the appropriate already created dictionary.

The building of the initial compression dictionary is quite similar to that disclosed above with reference to FIG. 7 for example, except that, to take into account the URL pattern, the static or by-default dictionary may comprise, in addition to a core part, one or more additional parts that are selected according to the URL pattern. For example, an additional part may be specific to image data, and another one to document data.

URL patterns can be described in many ways, and this document does not aim at listing them. As an example of a possible approach, a default dictionary, used for all the patterns, may be defined and complemented with additional dictionaries (e.g. one for images and one for documents in above example). With this approach, if the request matches a pattern, the corresponding initial compression dictionary is built based on the by-default core part of the static dictionary and the right additional part (of course private and shared parts as defined above are still considered). It there is no matching with a pattern, only the by-default core part of the static dictionary is considered.

Other approaches may however be implemented. For example, the private and/or shared parts of the local dictionaries may also be dependent on URL patterns.

After step 1030 or step 1020 if the initial compression dictionary for pattern PAT is available, a corresponding compression context is created at step 1040 using said initial compression dictionary.

If it is determined at step 1010 that a request matching pattern PAT has already been processed for the current connection, then a corresponding compression context has already been created and is retrieved at step 1050.

Steps 1040 and 1050 are followed by step 1060 during which an indication of the pattern PAT is added to the data packet to be sent.

As an example, if the patterns are described in a list, the indication may be the index of pattern PAT in that list. Such information helps the decompressor to select the appropriate URL-pattern-based dictionary to generate the decompression context.

Next, at step 1070, the data packet is compressed. In particular, the HTTP headers of that data packet are compressed using the initial compression dictionary as explained above.

The compressed data packet is appended to the data to be sent (in particular, appended to the URL pattern indication) and is then sent at step 1080.

The process then ends at step 1090.

Such approach shows that the invention supports different initial compression dictionaries for the same direction of transmission (for example from N1 to N2).

Although the present invention has been described hereinabove with reference to specific embodiments, the present invention is not limited to the specific embodiments, and modifications which lie within the scope of the present invention will be apparent to a person skilled in the art. Many further modifications and variations will suggest themselves to those versed in the art upon making reference to the foregoing illustrative embodiments, which are given by way of example only and which are not intended to limit the scope of the invention as determined by the appended claims. In particular different features from different embodiments may be interchanged, where appropriate.

For example, even though only one static dictionary is mentioned in the above description, using several static dictionaries is also possible. For example, in the context of HTTP exchanges (SPDY), a static dictionary SD may be defined for client messages, and another one for server messages. In that case, the static dictionary is selected according to an appropriate criterion (client or server; nature of the data packets; etc.) before it is added to the dynamic dictionary DD.

Also, as introduced above, the invention applies to any kind of compression dictionary that may be initialized before compressing data, including the Deflate compression dictionary or an indexing dictionary.

The invention claimed is:

1. A method of communicating data packets in a set of transmissions between a first communicating device and a second communicating device of a communications network, the method comprising:

exchanging, before the set of transmissions, first-device-provided packet information and second-device-provided packet information between the first communicating device and the second communicating device, wherein the first-device-provided packet information comprise a private part and a shared part of a dictionary local to the first communicating device and the second-device-provided packet information comprise a private part and a shared part of a dictionary local to the second communicating device;

generating, at the first communicating device, a first initial compression dictionary, and generating, at the second communicating device, a first initial decompression dictionary, both the first initial compression dictionary and the first initial decompression dictionary are generated based on the private and shared parts of the dictionary local to the first communicating device and the shared part of the dictionary local to the second communicating device;

generating, at the first communicating device, a second initial decompression dictionary, and generating, at the second communicating device, a second initial compression dictionary, both the second initial decompression dictionary and the second initial compression dictionary are generated based on the shared part of the dictionary local to the first communicating device and the private and shared parts of the dictionary local to the second communicating device;

using, at the first communicating device, the first initial compression dictionary to compress data packets of the set of transmissions before sending them, through the set of transmissions, over the communications network to the second communicating device; and using, at the first communicating device, the second initial decompression dictionary to decompress data packets received in the set of transmissions from the second communicating device via the communication network;

using, at the second communicating device, the second initial compression dictionary to compress data packets of the set of transmissions before sending them, through the set of transmissions, over the communications network to the first communicating device; and using, at the second communicating device, the first initial decompression dictionary to decompress data packets received in the set of transmissions from the first communicating device via the communication network.

2. The method of claim 1, wherein generating the initial compression dictionary comprises concatenating first-device-provided and second-device-provided compression dictionaries.

3. The method of claim 1, wherein the first communicating device and the second communicating device generate the same initial compression dictionaries for their respective first data packet transmission from themselves in the set.

4. The method of claim 1, wherein generating the initial compression dictionary is also based on a predefined compression dictionary known by both the first communicating device and the second communicating device.

5. The method of claim 1, wherein the initial compression dictionary depends on a URL pattern included in the data packet to be transmitted in a transmission of the set.

6. The method of claim 5, wherein the exchanged first-device-provided packet information and second-device-provided packet information are specific to the URL pattern.

7. The method of claim 1, wherein the first-device-provided and second-device-provided packet information comprises respective version numbers.

8. The method of claim 7, further comprising exchanging the version numbers between the first communicating device and the second communicating device, and checking the exchanged version numbers with version numbers associated with an already-generated initial compression dictionary.

9. The method of claim 7, wherein the version numbers comprise two pieces of version numbers, respectively for the private part and the shared part of the corresponding packet information.

10. The method of claim 1, wherein the set of transmissions belongs to the same connection over the communications network between the first communicating device transmitter and the second communicating device.

11. The method of claim 10, wherein exchanging the first-device-provided second-device-provided packet information is performed prior to establishing the connection to which the set of transmissions belongs.

12. The method of claim 11, wherein the first-device-provided and second-device-provided packet information is exchanged in periods of no data packet transmission during a first connection between the first communicating device and the second communicating device prior to the connection to which said set of transmissions belongs.

13. The method of claim 10, wherein an initial compression dictionary is obtained for each new connection between the first communicating device and the second communicating device, and the initial compression dictionary of a connection evolves with the compression of data packets for the set of transmissions of that connection.

14. The method of claim 1, wherein the first-device-provided and second-device-provided packet information is not compressed when exchanged.

15. The method of claim 1, wherein the first-device-provided packet information and the second-device-provided packet information comprise data relating to HTTP header contents, and compressing the data packets comprises compressing HTTP headers of the data packets using the initial compression dictionary.

16. The method of claim 15, wherein the first communicating device and the second communicating device form a client-server scheme.

17. The method of claim 1, wherein generating the initial compression dictionary at the first or second communicating device and the initial decompression dictionary at the other communicating device does not uses the exchanged private of the other's local dictionary; and generating the initial decompression dictionary at the first or second communicating device and the initial compression dictionary at the other communicating device does not use the exchanged private part of the dictionary local to the first or second communicating device.

18. The method of claim 1, wherein the private part of the dictionary local to one of the first and second communicating devices comprises packet information only used in the communication direction from this communicating device to the other communicating device.

19. The method of claim 18, wherein the packet information only used in the communication direction comprises HTTP header information relating only to HTTP requests.

20. The method of claim 1, wherein generating the initial compression dictionary or the initial decompression dictionary comprises selecting strings from lists of strings composing the private and shared parts, based on the presence of others strings within the lists of strings.

21. A network system comprising:
a first communicating device and a second communicating device communicating together in a communication network, through a set of transmissions of data packets;
an exchange module of the first communicating device exchanges, before the set of transmissions, with the second communicating device first-device-provided packet information comprises a private part and a shared part of a dictionary local to the first communicating device;
an exchange module of the second communicating device exchanges, before the set of transmissions, with the first communicating device second-device-provided packet information comprises a private part and a shared part of a dictionary local to the second communicating device;
generation means of the first communicating device generates a first initial compression dictionary, and generation means of the second communicating device, generates a first initial decompression dictionary, both generating being based on the private and shared parts of the dictionary local to the first communicating device and the shared part of the dictionary local to the second communicating device;
the generation means of the first communicating device generates a second initial decompression dictionary, and the generation means of the second communicating device generates a second initial compression dictionary, both generating being based on the shared part of the dictionary local to the first communicating device and the private and shared parts of the dictionary local to the second communicating device;
a compressor of the first communicating device uses the first initial compression dictionary to compress data packets of the set of transmissions before sending them, through the set of transmissions, over the communications network to the second communicating device; and
a communication module of the first communicating device sends, through the set of transmissions, the compressed data packet over the communications network to the second communicating device, and receives, though the set of transmissions, compressed data packets from the second communicating device via the communications network; and
a decompressor of the first communicating device uses the second initial decompression dictionary to decompress data packets received in the set of transmissions from the second communicating device via the communication network;
a compressor of the second communicating device uses the second initial compression dictionary to compress data packets of the set of transmissions before sending them, through the set of transmissions, over the communications network to the first communicating device; and
a communication module of the second communicating device sends, through the set of transmissions, the compressed data packet over the communications network to the first communicating device, and receives, though the set of transmissions, compressed data packets from the first communicating device via the communications network; and
a decompressor of the second communicating device uses the first initial decompression dictionary to decompress data packets received in the set of transmissions from the first communicating device via the communication network.

22. A non-transitory computer-readable medium storing instructions of a computer program which, when executed by a microprocessor or computer system in an apparatus, causes the apparatus to perform a method comprising:
exchanging, before the set of transmissions, first-device-provided packet information and second-device-provided packet information between the first communicating device and the second communicating device, wherein the first-device-provided packet information comprise a private part and a shared part of a dictionary local to the first communicating device and the second-device-provided packet information comprise a private part and a shared part of a dictionary local to the second communicating device;
generating, at the first communicating device, a first initial compression dictionary, and generating, at the second communicating device, a first initial decompression dictionary, both the first initial compression dictionary and the first initial decompression dictionary are generated based on the private and shared parts of the dictionary local to the first communicating device and the shared part of the dictionary local to the second communicating device;
generating, at the first communicating device, a second initial decompression dictionary, and generating, at the second communicating device, a second initial compression dictionary, both the second initial decompression dictionary and the second initial compression dictionary are generated based on the shared part of the dictionary local to the first communicating device and the private and shared parts of the dictionary local to the second communicating device;
using, at the first communicating device, the first initial compression dictionary to compress data packets of the set of transmissions before sending them, through the set of transmissions, over the communications network to the second communicating device; and using, at the first communicating device, the second initial decompression dictionary to decompress data packets received in the set of transmissions from the second communicating device via the communication network;

using, at the second communicating device, the second initial compression dictionary to compress data packets of the set of transmissions before sending them, through the set of transmissions, over the communications network to the first communicating device; and using, at the second communicating device, the first initial decompression dictionary to decompress data packets received in the set of transmissions from the first communicating device via the communication network.

* * * * *